(12) United States Patent
Sparing et al.

(10) Patent No.: US 8,945,298 B2
(45) Date of Patent: Feb. 3, 2015

(54) NON-ETCHING NON-RESIST ADHESION COMPOSITION AND METHOD OF PREPARING A WORK PIECE

(75) Inventors: Christian Sparing, Berlin (DE); Dirk Tews, Berlin (DE); Norbert Luetzow, Berlin (DE); Martin Thoms, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 579 days.

(21) Appl. No.: 12/867,112

(22) PCT Filed: Feb. 27, 2009

(86) PCT No.: PCT/EP2009/001605
§ 371 (c)(1),
(2), (4) Date: Aug. 11, 2010

(87) PCT Pub. No.: WO2009/109391
PCT Pub. Date: Sep. 11, 2009

(65) Prior Publication Data
US 2010/0323099 A1 Dec. 23, 2010

(30) Foreign Application Priority Data
Mar. 7, 2008 (EP) .................................... 08075181

(51) Int. Cl.
*H05K 3/28* (2006.01)
*C23C 22/02* (2006.01)
*C23C 22/52* (2006.01)
*C23F 11/173* (2006.01)
*C23F 11/14* (2006.01)
*C23F 11/16* (2006.01)
*H05K 3/38* (2006.01)
*C23F 11/12* (2006.01)
*H05K 3/06* (2006.01)
*H05K 3/10* (2006.01)

(52) U.S. Cl.
CPC ................ *H05K 3/389* (2013.01); *C23F 11/16* (2013.01); *C23F 11/149* (2013.01); *H05K 2203/12* (2013.01); *C23C 22/02* (2013.01); *C23C 22/52* (2013.01); *C23F 11/12* (2013.01); *C23F 11/128* (2013.01); *C23F 11/165* (2013.01); *C23F 11/173* (2013.01); *H05K 3/064* (2013.01); *H05K 3/108* (2013.01); *H05K 3/282* (2013.01); *H05K 2203/122* (2013.01); *H05K 2203/124* (2013.01)
USPC ............... 106/287.21; 106/287.25; 106/287.3

(58) Field of Classification Search
USPC .............................. 106/287.21, 287.25, 287.3
See application file for complete search history.

(56) References Cited

U.S. PATENT DOCUMENTS

| 3,645,772 A | 2/1972 | Jones |
| 4,372,913 A | 2/1983 | Klein |
| 2002/0192460 A1 | 12/2002 | Kawaguchi et al. |
| 2006/0115671 A1 | 6/2006 | Shinta et al. |
| 2006/0210819 A1 | 9/2006 | Dueber |
| 2007/0003860 A1 | 1/2007 | Takeda et al. |
| 2007/0034606 A1 | 2/2007 | Dietsche et al. |

FOREIGN PATENT DOCUMENTS

| EP | 0215670 A2 | 3/1987 |
| EP | 0422229 A1 | 8/1990 |
| EP | 0890660 A1 | 1/1999 |
| EP | 1209253 A2 | 11/2001 |
| FR | 2337890 | 8/1977 |
| JP | 61-266241 A | 11/1986 |
| JP | 2002-321310 A | 11/2002 |
| JP | 2006-80324 A | 3/2006 |
| JP | 2006-182019 A | 7/2006 |
| WO | WO0204706 A1 | 1/2002 |
| WO | WO2005033364 A1 | 4/2005 |

OTHER PUBLICATIONS

Maybridge, Material Safety Data Sheet for 3-amino-5-mercapto-1,2,4-triazole, (Dec. 10, 2007).*
Sigma-aldrich, Safety Data Sheet, 3-amino-1,2,4-triazole-5-thiol, (Jan. 22, 2014).*
1,2,4-Triazole, Organic Synthesis, Coll., vol. 40, p. 99 (1960).*
Sigma-Aldrich, Material Safety Data Sheet, 3-Mercapto-1,2,4-Triazole, (Jan. 2006).*
Coombs, Printed Circuits Handbook 5th Edition, Table of Contents, Preface, and Chapter 26, Aug. 2001.
K.H. Dietz in: Dry Film Photoresist Processing Technology, Electrochemical Publications Ltd., 2001.
Coombs, Printed Circuits Handbook 5th Edition, Aug. 2001.
Sherif et al, "Corrosion of copper in aerated acidic pickling solutions and its inhibition by 3-amino-1,2,4-triazole-5thiol," Journal ofColloid and Interface Science, Academic Press, New York, NY, US, vol. 306, No. 1, Dec. 1, 2006, pp. 96-104, XP005748160 ISSN: 0021-9797.
"Tech Talk: Fine Lines in High Yield (Part CXLVIII): Adhesion to Copper—Trends and Issues," published under URL http://www.circuitree.com/copyright/2FBNP_GUID_9-5-2009_A_10000000000000244144&message=1, posted Jan. 1, 2008.
"Tech Talk: Fine Lines in High Yield (Part CXXV): Fine Lines—Beyond the Limits of Semi-Additive Processing?," published under URL http://www.circuitree.com/Articles/Column/16bc3b84a7809010VgnVCM100000f932a8c0_, posted Jan. 29, 2006.

* cited by examiner

*Primary Examiner* — David M Brunsman
(74) *Attorney, Agent, or Firm* — Paul & Paul

(57) ABSTRACT

To achieve good adherence of a resist coating, more specifically a photo imageable resist coating, to a copper base while ensuring that the copper base being very thin is not compromised, a non-etching non-resist composition for the treatment of the copper base is provided, said composition comprising at least one adhesion agent selected from the group comprising (i) heterocyclic compounds comprising at least one thiol moiety and (ii) quaternary ammonium polymers having the following general chemical formula: $\{N^+(R^3)(R^4)-(CH_2)_a-N(H)-C(Y)-N(H)-(CH_2)_b-N^+(R^3)(R^4)-R^5\}_n$ $2n\,X^-$, with $R^1$, $R^2$, $R^3$, $R^4$, $R^5$, Y and $X^-$ being defined as claimed.

12 Claims, 11 Drawing Sheets

NON-ETCHING NON-RESIST ADHESION COMPOSITION AND METHOD OF PREPARING A WORK PIECE

This application is a 371 filing of PCT/EP2009/001605, filed Feb. 27, 2009.

FIELD OF THE INVENTION

The present invention relates to a non-etching non-resist adhesion composition for the treatment of copper or copper alloys and to a method of preparing a work piece having a copper or copper alloy surface for subsequent coating the copper or copper alloy surface with a polymeric deposit, using the non-etching non-resist adhesion composition.

BACKGROUND ART

Methods of preparing a work piece having a copper or copper alloy surface, more specifically a copper clad printed circuit board material, for subsequent coating the surface thereof with a polymeric deposit, more specifically with a photo imageable resist, are well-known in the art. At various stages in the process of manufacturing printed circuit boards, resist deposits are coated to the copper surface of the printed circuit board material and must excellently adhere to the copper base. For example, in creating copper structures, i.e., lines as well as bonding and soldering pads, a photo imageable resist is used to define these structures. Furthermore, after these copper structures have been created, a solder mask is applied to the structures in those regions which shall not be soldered. In both cases, the resist is applied to the copper surface and must well adhere thereto both during the imaging process (exposing and developing) and during any subsequent process steps, like copper plating (in the course of copper structure generation) and soldering.

For this reason, pre-treatment of the copper surfaces is at all events to be performed in order to prepare the copper surface for a good resist reception and hence excellent adherence thereon. Etching solutions are used for this purpose, such as for example solutions containing an oxidant for copper, like hydrogen peroxide, sodium peroxodisulfate or sodium caroate. Etching has generally been considered indispensable because etching is used to roughen the copper surface. This is because roughening has been considered requisite to achieve good adherence of the resist to the copper surface.

An example for such etching solutions is disclosed in WO 02/04706 A1. The etching solution described in this document is acidic and contains hydrogen peroxide, at least one five-membered nitrogen containing heterocyclic compound and additionally at least one microstructure modifying agent which is selected from the group comprising organic thiols, organic sulfides, organic disulfides and thioamides. The five-membered nitrogen containing heterocyclic compounds are tetrazoles and the derivatives thereof, such as 5-aminotetrazole and 5-phenyltetrazole. The microstructure modifying agents are for example selected from the group comprising L- and DL-cysteine, L-, DL- and D-cystine, 2-aminoethanethiol, mercaptoacetic acid, 3-mercaptopropionic acid, 2-mercaptoethanesulfonic acid, 3-mercaptopropanesulfonic acid, bis-(2-aminoethyl)disulfide, dithioacetic acid, 3,3'-dithiodipropionic acid, 4,4'-dithiodibutyric acid, 3,3'-dithio-bis-(propanesulfonic acid), thiodiacetic acid, 3,3'-thiodipropionic acid, thiourea, thiobenzamide and the salts thereof. Pre-treatment of the copper surfaces is performed to achieve good adherence of plating resists, etch resists, solder masks and other dielectric films thereon. Though little etching off of copper has been an object in this document in order to achieve low copper thickness variation due to the etching off, 10% etching off of the copper relating to the overall thickness of the copper layer is still required to achieve good adherence. Furthermore, a variety of other etching solutions are mentioned in this document, which also contain hydrogen peroxide or another oxidant for copper.

Further, EP 0 890 660 A1 discloses a microetching agent for copper or copper alloys. This agent also contains hydrogen peroxide, further sulfuric acid and, in addition, at least one compound selected from the group consisting of tetrazoles and tetrazole derivatives. More specifically the tetrazole derivatives may be 1-methyltetrazole, 2-methyltetrazole, 5-aminotetrazole, 5-amino-1-methyltetrazole, 1-phenyltetrazole and 5-phenyltetrazole. This solution is used to roughen the copper surface of a printed circuit board by microetching and imparting deep, biting ruggedness in the copper surface of a depth of 1 to 5 µm.

U.S. Pat. No. 3,645,772 discloses a process for improving bonding of a photoresist to copper. This process comprises scrubbing plastic boards having a copper foil with pumice, rinsing and drying same and then treating the roughened copper foil with a nitrogen-containing organic compound, which contains at least one other hetero-atom and a five- or six-membered ring. Preferred other hetero-atoms are reported to be nitrogen, sulfur, oxygen and selenium. Such heterocyclic compounds having nitrogen and one other hetero-atom may be 2-amino-6-methyl-benzothiazole, 2-mercaptobenzimidazole, thiobenzanilide, benzotriazole, 2-mercaptobenzothiazole, 2-mercaptothiazoline, 3-amino-1,2,4-triazole, 5-aminotetrazole monohydrate, tolutriazole, 1,2-naphthotriazole, 1-phenyl-3-mercaptotetrazole, 2-guinidinobenzimidazole and 1-chlorobenzotriazole.

The aforementioned etching solutions, however, are not suitable to be used in recent most sophisticated processes in which finest lines and other structures on the printed circuit boards are generated, like 5 µm lines and 5 µm spaces. In order to produce such ultra-fine circuitry, very thin copper is plated prior to forming these structures by etching. As copper in these processes is deposited by electroless plating, thickness thereof is about 1 µm only, for example. Meanwhile, using the above conventional microetchants, copper will be removed to a depth of at least 1 or 2 µm. For this reason, there will be the risk to totally remove the copper layer in at least part of the region on the surface due to the microetching step. This of course, will not be acceptable. For this reason, etching is considered detrimental to the consistency of the copper base.

In addition to including nitrogen containing organic heterocycles such as imidazoles, triazoles or thiazoles into the resist material, to attain good adherence of a resist to copper surfaces, K. H. Dietz in: *Dry Film Photoresist Processing Technology*, Electrochemical Publications Ltd., 2001, reports on using antitarnishing agents. Such agents may be strong or mild, the strong ones being benzotriazole and the derivatives thereof and the mild ones being hydroxycarboxylic acids such as citric acid. It has yet been ascertained that benzotriazole is not effective as non-etching adhesion promoter because it can only react with the metal surface and not with the photo imageable resist.

Further, EP 1 209 253 A2 discloses a process for treating adhesion promoted copper surfaces with epoxy resins in order to promote adhesion between a patterned circuitry innerlayer and a partially cured dielectric substrate material layer to form a multilayer. The process comprises treating the copper surfaces with an adhesion promotion composition first and an epoxy resin composition thereafter. The adhesion promotion composition may contain an oxidizer, an acid and a corrosion inhibitor. The corrosion inhibitor may be selected from the group comprising pyrroles, azoles, oxazoles, thiazoles, pyrazoles, triazoles, benzotriazoles, tetrazoles, tolytriazol, hydroxy-substituted azole compounds, imidazoles and benzimidazoles. Additionally the composition may contain a quaternary ammonium compound.

US 2006/0210819 A1 discloses polyimide composite coverlayers derived from two-layer polyamic acid-based composites having a cover layer and adjacent thereto an adhesive layer, wherein the adhesive layer comprises a polyimide base polymer and initially a polyamic acid precursor to the adhesive layer polyimide base polymer. The adhesive layer may be formed from a composition which may contain, inter alia, an adhesion promotor which may contain a heterocyclic or mercaptan compound. Useful adhesion promotors include 2-amino-5-mercaptothiophene, 5-amino-1,3,4-thiodiazole-2-thiol, benzotriazole, 5-chloro-benzotriazole, 1-chlorobenzotriazole, 1-carboxy-benzotriazole, 1-hydroxy-benzotriazole, 2-mercaptobenzoxazole, 1H-1,2,4-triazole-3-thiol and mercaptobenzimidazole.

WO 2005/033364 A1 discloses a method for pickling metallic surfaces by using an acidic solution containing an alkoxylated alkynol and optionally nitrogen containing polymers which comprise quaternary ammonium compounds having for example the following chemical formula:

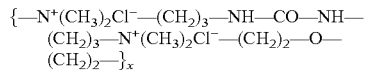

OBJECT OF THE INVENTION

It is therefore an object of the present invention to provide a method to achieve good adherence of a resist coating, more specifically a photo imageable resist coating, to a copper base while ensuring that the copper base being very thin is not compromised by the method.

Another object of the present invention is to provide a method of forming finest copper structures on a circuit carrier substrate, more specifically a printed circuit board substrate.

Yet another object of the present invention is to provide a method of forming finest copper structures on a circuit carrier substrate while allowing removing at most 0.1 to 0.2 μm of copper.

Yet another object of the present invention is to provide a non-resist adhesion composition for the treatment of copper or copper alloys.

Yet another object of the present invention is to ensure that the above methods are performed easily, i.e., with only a few process steps.

SUMMARY OF THE INVENTION

One first aspect of the present invention is a non-etching non-resist composition for the treatment of copper or copper alloys.

A second aspect of the present invention is a method of preparing a work piece having a copper or copper alloy surface for subsequent coating the copper or copper alloy surface with a polymeric deposit.

A third aspect of the present invention is a method of forming copper structures on a circuit carrier substrate, using a semi-additive process sequence.

A fourth aspect of the present invention is a method of forming copper structures on a circuit carrier substrate, using a panel plating process sequence The above objects and further objects are achieved by a non-etching non-resist composition for the treatment of copper or copper alloys which contains at least one adhesion agent selected from the group comprising (i) heterocyclic compounds comprising at least one thiol moiety, and (ii) quaternary ammonium polymers having general chemical formula II:

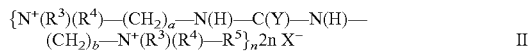

wherein:
- $R^3$ and $R^4$ are independently methyl, ethyl, isopropyl, hydroxymethyl, hydroxyethyl or $-CH_2CH_2(OCH_2CH_2)_cOH$;
- $R^5$ is $(CH_2)_d$ or $\{(CH_2)_eO(CH_2)_f\}_g$;
- Y is O, S or NH;
- a, b, c, d, e and f are each independently an integer from 1 to about 6;
- g is an integer from 1 to about 4;
- n is an integer being at least 1 and may be at most 200, preferably at most 100, more preferably at most 50 and most preferably at most 20; and
- $X^-$ is a halide (fluoride, chloride, bromide, iodide, most preferably chloride) ion.

The above adhesion agents have turned out to be effective in preparing a copper surface for achieving good adherence of a polymeric deposit being applied thereon. Such good adhesion has particularly found out to be attained if the copper surface does not have a rough surface, but is substantially smooth. Even under these conditions good adherence of the polymeric deposit may be achieved, though hitherto it has been assumed that good adherence may only be observed if the copper surface has been made rough or is rough as prepared. This result is astonishing since a strong bond between the copper and the polymeric deposit has been believed to be only due to an enlargement of the specific surface area of the copper surface. Good adherence has been proved by visually inspecting consistency of a finest line pattern in a photo imageable photoresist laminated on a copper surface and exposed and developed and additionally by testing adherence with a tape test at such processed photo imageable photoresist layer.

Consistency and adherence have been proved excellent. This is in spite of the fact that the copper surface is not substantially affected by the pretreatment method of the invention, i.e., no noticeable roughening takes place when the copper surface is treated in accordance with the invention. Therefore, there is no risk as to excessive removal of copper due to the treatment as with previous methods. Such removal would particularly be important if the copper surface presented is very thin such as in semi-additive processing. Base substrates used in printed circuit board manufacturing for high-sophisticated applications comprise an electroless copper base layer which is only about 1 μm thick and onto which a photo imageable resist is laminated and processed to form a circuitry. As copper pretreatment according to the present invention does virtually not remove any copper from such thin copper base layers, there is, even in portions of the surface area, no risk of complete copper removal. Copper removal using the compounds according to the invention has emerged to be at most 0.1 to 0.2 μm of copper.

Good adherence despite low roughness is assumed to be due to certain specific structural features present in the adhesion agent molecules which mediate adherence between the copper surface and the polymeric deposit. In the case of the heterocyclic compounds comprising at least one thiol moiety, the thiol moiety is believed to be effective in strongly bonding to the copper surface while the heterocyclic ring system is believed to be effective in strongly bonding to the polymeric deposit. In the case of the quaternary ammonium polymers having general chemical formula II, the NH—C(═Y)—NH moiety is believed to strongly bond to the copper surface while the intermediate moiety (N⁺(R³)(R⁴)—R⁵—N⁺(R³)(R⁴)) is believed to strongly bond to the polymeric deposit:

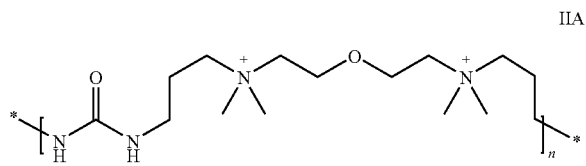

IIA

The above compound (commercially available as Polyquaternium-2 of Sigma-Aldrich is the chloride salt thereof) is a preferred example of a quaternary ammonium polymer, wherein Y═O, R³, R⁴═CH₃ and R⁵═CH₂CH₂—O—CH₂CH₂.

The adhesion agents of the invention are applied to the copper surface by bringing the work piece into contact with the non-etching non-resist composition which contains the at least one adhesion agent. Such contacting of the non-etching non-resist adhesion composition with the work piece will be performed by dipping the work piece into the composition or by spraying the composition on the surface of the work piece.

BRIEF DESCRIPTION OF THE DRAWINGS

To illustrate the present invention, examples are given in the following. These do not limit the scope of the invention, but are rather specific embodiments of the invention.

DETAILED DESCRIPTION OF THE INVENTION

Figure 1:
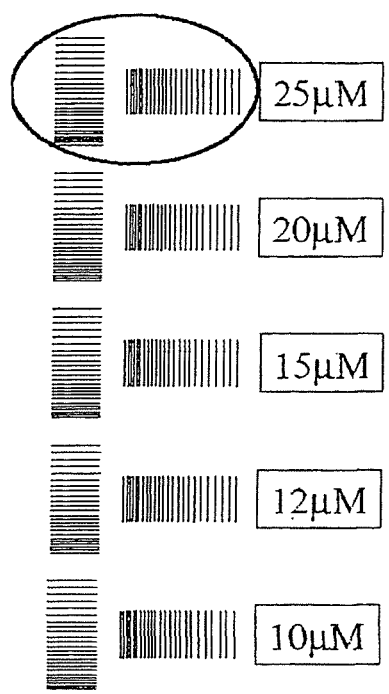
FIG. 1 shows an artwork of fine lines used for imaging a photo imageable resist.
Figure 2:
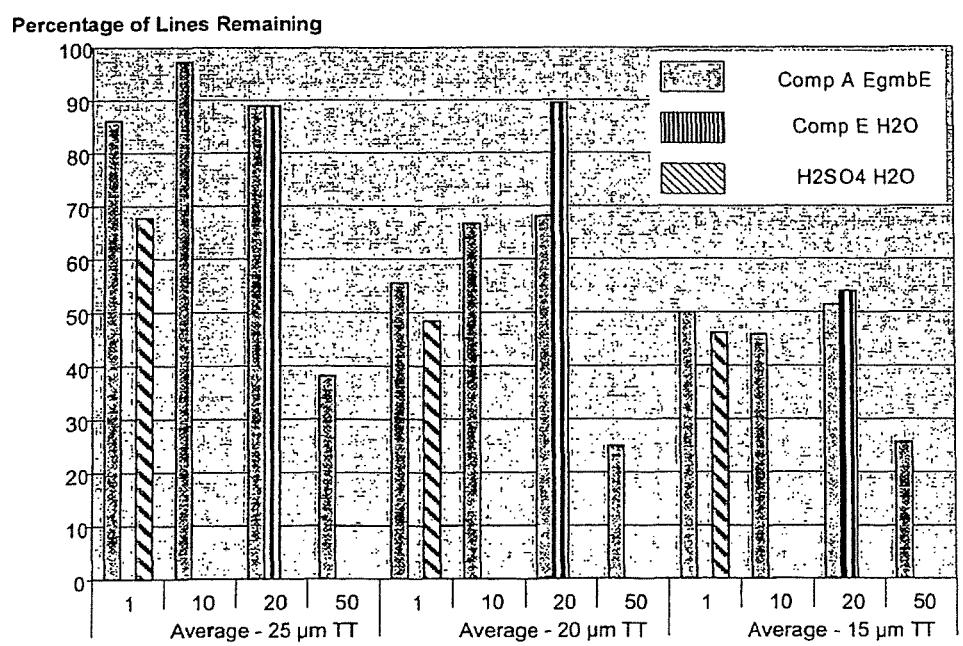
FIG. 2 shows results from pre-treating a coppered substrate with compound E (influence of concentration) and are compared to treatment with compound A and with H₂SO₄.
Figure 3:
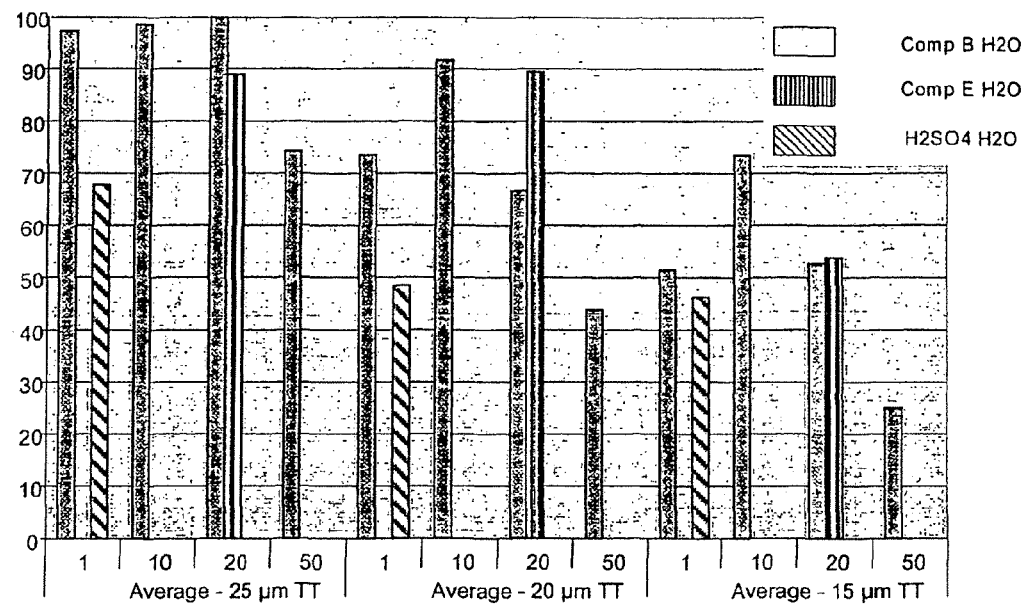
FIG. 3 shows results from pre-treating a coppered substrate with compound E (influence of concentration) and are compared to treatment with compound B and with H₂SO₄.
Figure 4:
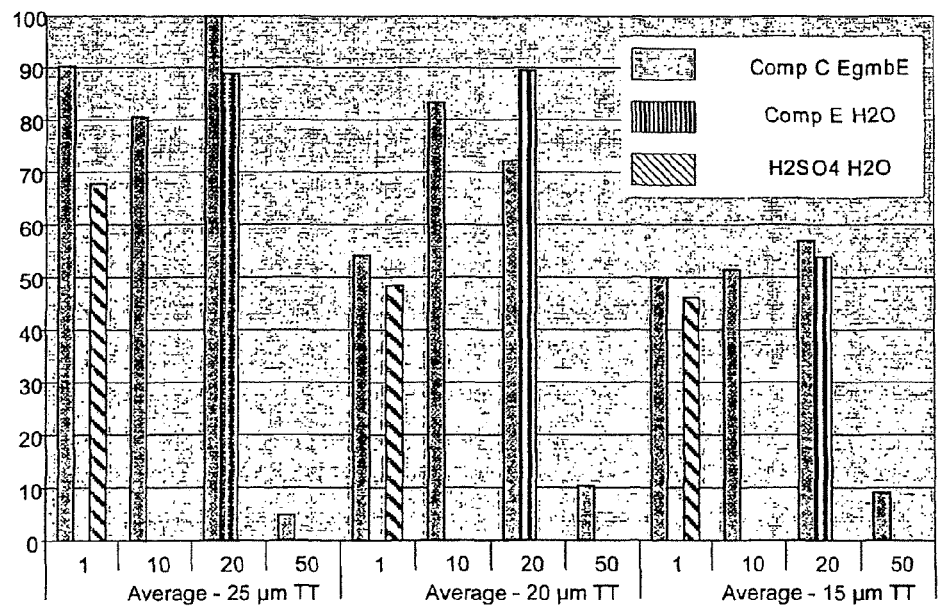
FIG. 4 shows results from pre-treating a coppered substrate with compound E (influence of concentration) and are compared to treatment with compound C and with H₂SO₄.
Figure 5:
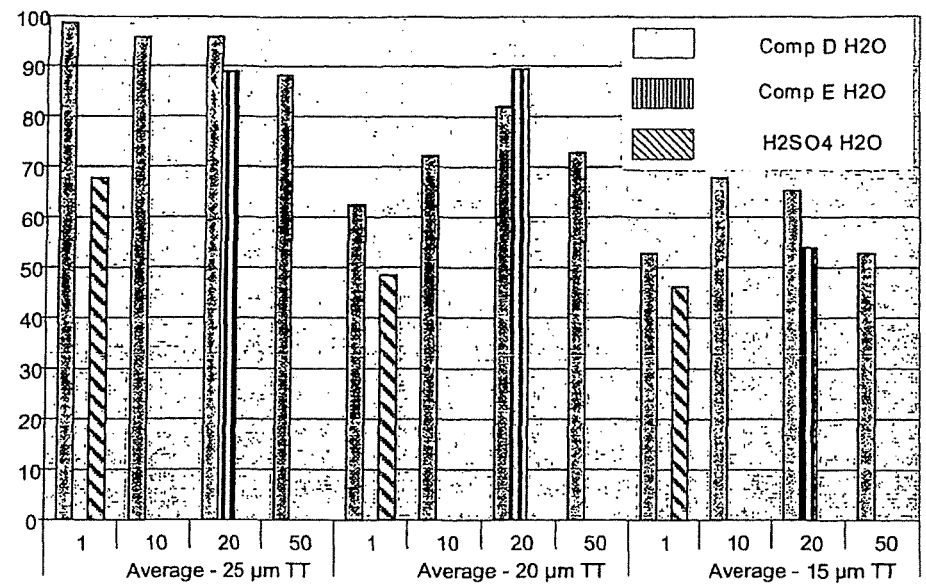
FIG. 5 shows results from pre-treating a coppered substrate with compound E (influence of concentration) and are compared to treatment with compound D and with H₂SO₄.

For the purpose of the present invention the term "alkyl" is defined herein as a group of saturated compounds having in the skeleton thereof but carbon atoms, these compounds comprising all conceivable isomers thereof. For example, $C_1$-$C_6$ alkyl means methyl, ethyl, propyl, isopropyl, butyl, isobutyl, tert-butyl, pentyl, isopentyl, tert-pentyl, neo-pentyl, hexyl, 2-methyl pentyl, 3-methyl pentyl, 2,3-diethyl butyl and $C_1$-$C_4$ alkyl means methyl, ethyl, propyl, isopropyl, butyl, isobutyl, tert-butyl.

For the purpose of the present invention the term "phenyl" is defined herein as an aromatic moiety which has in its aromatic skeleton six carbon atoms.

For the purpose of the present invention the term "oxirane" is defined herein as a three-membered cyclic radical having an oxygen atom and two carbon atoms in the ring, the simplest specimen being an epoxide ring which is an unsubstituted oxirane.

For the purpose of the present invention the term "thiol" or "mercaptan" means a —SH moiety.

For the purpose of the present invention the term "circuit carrier" is defined herein as a device which is used to provide electrical interconnections between various electronic components and other components mounted thereon, such as resistors, capacitors, transistors, integrated circuits, transformers, LEDs, switches, edge connectos and the like. A circuit carrier may be a printed circuit board or a hybrid circuit board or a multi chip module or the like.

For the purpose of the present invention the term "non-resist" in the term "non-etching non-resist composition" is defined herein to indicate that the composition is not a film forming composition which means that it does not contain a binder for example, like a polymer binder, for forming a film on the surface of the treated copper or copper alloy surface. Therefore, the composition of the present invention is not used to form a polymer layer on the surface to be treated, such as a resist layer which is used to prevent part of the surface being soldered for example or to prevent etching of exposed copper for example or to prevent metal deposition on exposed copper for example.

The non-etching non-resist composition providing good adherence between a smooth copper surface and a polymeric deposit, a photo imageable resist for example, is primarily composed of the at least one adhesion agent according to the invention and at least one solvent, like water or an organic solvent such as an ethylene glycol solvent. An ethylene glycol solvent may be an ethylene glycol ether or an ethylene glycol ester, wherein the ethylene glycol moiety may for example be a mono ethylene glycol moiety or a diethylene glycol moiety. For example, such solvent may be diethylene glycol monomethyl or monoethyl ether The non-etching non-resist composition may be acidic, neutral or alkaline, more preferably slightly alkaline (pH from neutral to about 9.5). Most preferably the non-etching non-resist composition is acidic. If the non-etching non-resist composition is acidic, either the at least one adhesion agent is acidic per se, or there is at least one additional compound present in the composition which provides the composition with an acidic pH, i.e., a pH below about 7, more specifically below about 4, more preferably below about 1.5 and most preferably below about 1. The lower limit of the pH is dependent on the compound being used to adjust pH and may be above about −0.5, more preferably above about 0 and most preferably above about 0.5.

Further, according to a preferred embodiment of the invention, the heterocyclic compounds comprising at least one thiol moiety, comprise a heterocyclic moiety which contains at least two, even more preferably three nitrogen atoms. More specifically, these compounds are characterized by having a single ring moiety comprising these nitrogen atoms. Even more specifically, these compounds are substituted, apart from the at least one thiol moiety, with at least one of alkyl, amino and alkoxy. Even more preferably these compounds are triazole compounds which are substituted with at least one thiol moiety. More preferably the heterocyclic compounds comprising at least one thiol moiety are selected from the group comprising compounds having formulae IIIA and IIIB:

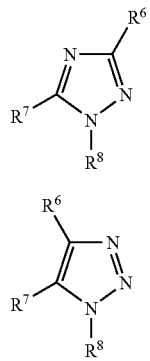

wherein
$R^6$ and $R^7$ are independently selected from the group comprising H, $SR^9$, $OR^9$, $NR^{10}R^{11}$ and $C_1$-$C_4$ alkyl;
$R^8$ is H or $C_1$-$C_3$ alkyl;
$R^9$ is selected from the group comprising H, Li, Na, K and $NH_4$;
$R^{10}$ and $R^{11}$ are independently selected from the group comprising H, $CH_3$ and $C_2H_5$;
with the proviso that at least one of $R^6$ and $R^7$ is $SR^9$ with $R^9$ being preferably H.

In a more preferred embodiment of the present invention, the heterocyclic compounds comprising at least one thiol moiety are selected from the group comprising 1H-1,2,4-triazole-3-thiol (1,2,4-triazole-3-thiol, 3-mercaptotriazole, CAS No. 3179-31-5), 3-amino-1,2,4-triazole-5-thiol (3-amino-5-mercapto-1,2,4-triazole, CAS No. 16691-43-3), 2-mercaptobenzothiazole and 2-mercaptobenzimidazole. 1H-1,2,4-triazole-3-thiol and 3-amino-1,2,4-triazole-5-thiol are the most preferred adhesion agents in the sense of the present invention.

Further, according to a preferred embodiment of the invention, in the quaternary ammonium polymers having general chemical formula II, $R^3$ and $R^4$ are methyl.

Further, according to a preferred embodiment of the invention, in the quaternary ammonium polymers having general chemical formula II, a and b are 3.

Further, according to a preferred embodiment of the invention, in the quaternary ammonium polymers having general chemical formula II, Y is O.

Further, according to a preferred embodiment of the invention, in the quaternary ammonium polymers having general chemical formula II, $R^5$ is $\{(CH_2)_eO(CH_2)_f\}_g$.

Further, according to a preferred embodiment of the invention, in the quaternary ammonium polymers having general chemical formula II, e and f are 2.

Further, according to a preferred embodiment of the invention, in the quaternary ammonium polymers having general chemical formula II, g is 1.

Further, according to a preferred embodiment of the invention, in the quaternary ammonium polymers having general chemical formula II, $X^-$ is chloride Further, according to a preferred embodiment of the invention, the quaternary ammonium polymer has the following general chemical formula IIA:

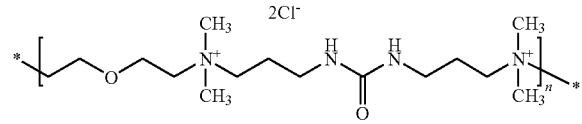

Preferably the concentration of the adhesion agent in the non-etching non-resist composition of the invention is at least about 1 mg/l, more preferably at least about 2 mg/l, even more preferably at least about 5 mg/l and most preferably at least about 10 mg/l and may be for example about 10 or about 15 or about 20 or about 30 mg/l. The concentration of the adhesion agent in the non-etching non-resist composition of the invention is at most about 1000 mg/l, more preferably at most about 500 mg/l, even more preferably at most about 200 mg/l, even more preferably at most about 100 mg/l and most preferably at most about 50 mg/l. Any range delimited by the above values may be used to define the concentration range of the adhesion agent. If more than one adhesion agent is used in the non-etching composition, the above concentration values are meant to define the sum of all concentrations of adhesion agents contained in the composition.

In order to assure that copper is virtually unaffected by the non-etching non-resist composition, this composition is free of an oxidant for copper or the copper alloy. Therefore, this composition does not etch copper. Therefore, the composition is free of hydrogen peroxide, any salts of peroxodisulfate, any salt of caroate and of any other peroxide like perboric acid or performic acid, for example.

As stated above, the non-etching non-resist composition further comprises at least one mineral acid or at least one organic acid. In general, these acids render the composition acidic, such that the pH thereof is attained to be in the range defined herein above.

More preferably, the mineral acid is selected from the group comprising sulfuric acid and phosphoric acid. Most preferably it is sulfuric acid. The concentration of the sulfuric acid is preferably at least about 5 ml, more preferably at least about 50 ml, even more preferably at least about 75 ml and most preferably at least about 100 ml concentrated sulfuric acid in 1 l of the composition and is preferably at most about 300 ml, more preferably at most about 250 ml, even more preferably about 200 ml and most preferably at most about 150 ml concentrated sulfuric acid in 1 l of the composition.

As stated above, the method of the present invention comprises: (a) providing the work piece and (b) bringing the work piece into contact with the non-etching non-resist composition of the invention.

If the adhesion agent is a heterocyclic compound comprising at least one thiol moiety, the copper surface to be treated is preferably first contacted with an aqueous solution of a mineral acid, to remove any soil from the copper surface prior to having the adhesion agent impacting on the copper surface. This mineral acid may be sulfuric acid. An aqueous solution of sulfuric acid may have a concentration of from about 10 ml to about 150 ml, more preferably about 20 ml to about 100 ml and is most preferably about 50 ml concentrated sulfuric acid in 1 l of this solution for example.

Alternatively, in a preferred embodiment of the present invention, the method of the invention further comprises another method step which is preferably performed subsequent to treating the copper or copper alloy surface with the non-etching non-resist composition, said further method step comprising: (c) bringing the work pieces into contact with at least one phosphonic acid compound, if the adhesion agent is selected from the group comprising the quaternary ammonium polymers having general chemical formula II. This post-treatment provides for an additional adhesion improvement.

The phosphonic acid compounds are preferably selected from the group comprising hydroxyethylidene diphosphonic acid, amino tri(methylene phosphonic acid), diethylenetriamine penta(methylene phosphonic acid), polyamino phosphonic acid, bis(hexamethylene triamine penta(methylene phosphonic acid)) and 2-phosphonobutane 1,2,4-tricarboxylic acid or the salts thereof. Most preferably the phosphonic acid compound is hydroxyethyliden diphosphonic acid (INN: etidronic acid). A 60 wt.-% aqueous solution of this compound is sold under the trade name Dequest® 2010 (Thermophos Deutschland, Del.).

The phosphonic acid compound is used as an aqueous solution thereof to post-treat the copper surfaces, if the adhesion agent is selected from the group comprising quaternary ammonium polymers having general chemical formula II. This aqueous solution contains the at least one phosphonic acid compound at a concentration of 0.01 to 100 g, preferably 1 to 10 g per liter of the solution, for example, wherein this range refers to the overall concentration of all phosphonic acid compounds in the aqueous solution.

In an alternative embodiment of the present invention, if the adhesion agent is selected from the group comprising quarternary ammonium polymers having general chemical formula II, instead of post-treating the copper surfaces with at least one phosphonic acid compound, the method further comprises another method step which is preferably performed subsequent to treating the copper or copper alloy surface with the non-etching non-resist composition, said further method step comprising: (c) bringing the work piece into contact with at least one acrylic compound having general chemical formula I:

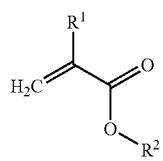

I wherein
$R^1$ is H or $C_1$-$C_4$ alkyl;
$R^2$ is $C_1$-$C_{20}$ alkyl, which may be substituted by at least one moiety selected from the group comprising OH, unsubstituted and substituted phenyl, unsubstituted and substituted phenoxy, amino, alkylene(alkylamino), alkylene(dialkylamino), alkylene(trialkylammonium ion) and alkylene oxirane.

This also provides for an additional adhesion improvement.

The C=O moiety of the acrylic compounds having general chemical formula I is believed to be effective in strongly bonding to the copper surface while the unsaturated structure element in the acrylic moiety of the molecule is believed to strongly bond to the polymeric deposit.

More specifically, in the acrylic compounds having general chemical formula I, $R^2$ is $(CH_2)_m$—$R^{12}$,
wherein:
m is an integer from 1 to 20,
$(CH_2)_m$ may be substituted in at least one of the $CH_2$ moieties with OH and may also be branched instead of being unbranched, as $(CH_2)_m$ suggests;
$R^{12}$ is H, phenyl, O-Phenyl, $NR^{13}R^{14}$, $N^+R^{13}R^{14}R^{15}$ $Z^-$ or an oxirane ring;
wherein phenyl is unsubstituted or substituted; $R^{13}$, $R^{14}$ and $R^{15}$ are, independently, H or $C_1$-$C_6$ alkyl, the oxirane ring is substituted or unsubstituted and $Z^-$ is an anion.

Even more specifically, in the acrylic compounds having general chemical formula I, $R^1$ is $CH_3$.

Even more specifically, in the acrylic compounds having general chemical formula I, the $(CH_2)_m$ moiety is $CH_2$—CH(OH)—$CH_2$.

Even more specifically, in the acrylic compounds having general chemical formula I, phenyl is 3-(benzotriazol-2-yl)-4-hydroxy-phenyl.

Even more specifically, in the acrylic compounds having general chemical formula I, the oxirane ring is an unsubstituted epoxide ring.

Even more specifically, in the acrylic compounds having general chemical formula I, $R^2$ is $(CH_2)_m$—$R^{12}$, wherein m is an integer from 1 to 20 and $R^{12}$ is H.

Even more specifically, in the acrylic compounds having general chemical formula I, m is an integer from 10 to 19 and $R^{12}$ is H.

Even more specifically, in the acrylic compounds having general chemical formula I, $NR^{13}R^{14}$ is $NHC(CH_3)_3$.

Even more specifically, in the acrylic compounds having general chemical formula I, $N^+R^{13}R^{14}R^{15}$ $Z^-$ is $N^+(CH_3)_3$ $Z^-$.

Even more specifically, the acrylic compounds having general chemical formula I are selected from the group comprising methacrylic acid octadecyl ester, methacrylic acid 2-phenoxyethylester, 3-(methacryloyloxy)-2-hydroxypropyl ester, 2-[3-(2H-benzotriazol-2-yl)-4-hydroxyphenyl]ethyl methacrylate, 2-(tert-butylamino)ethyl methacrylate, 2-(methacryloyloxy)ethyl trimethylammonium methosulfate and (acryloyloxy)methyl oxirane.

Therefore, the method of the invention is performed easily, i.e., with only a few process steps being required.

The non-etching non-resist composition may be used to pre-treat a copper surface in a process used to manufacture circuit carriers, more preferably printed circuit boards. In this case the polymeric deposit is a resist coating, more preferably a photo imageable resist.

For the manufacture of a circuit carrier, more preferably a printed circuit board,
(a) a substrate is generally used which comprises a copper coating on at least one side thereof and which is further provided with through-holes which serve to electrically contact individual circuit planes within the carrier;
(b) this substrate is first copper coated on the outer sides and on the hole walls, in general with electroless copper plating only or with electroless and subsequently electrolytic copper plating or with electrolytic copper plating only.

Further processing depends on the methods involved:

In the panel plating process variation, in general, a copper clad (17 μm thick copper outer layer) material is used, which is drilled to form the through-holes and is then electrolytic copper-plated to provide electrical conductivity in the through-holes. The panel plating method further comprises the following general method steps:

(c) pre-treating the copper layer formed in method step (b) with the non-etching non-resist composition of the invention;

(d) applying a resist to the coppered surface and imaging the resist, thereby forming resist voids;

(e) removing copper which is exposed in the resist voids; and (f) stripping the resist from the surface of the copper surface; the resist is preferably a photo imageable resist.

In the semi-additive plating process variation, in general, a substrate material is used, which is provided on the outer sides with a dielectric surface and which, after having been drilled to form the through-holes, is copper-plated to form a thin copper layer on the outer sides. In this case, a conventional printed circuit board may be used for example which is additionally provided with a resin coating on the outer sides to form the dielectric surface. The semiadditive plating method further comprises the following general method steps:

(c) pre-treating the copper layer formed in method step (b) on the outer sides of the substrate with the non-etching non-resist composition of the invention;

(d) applying a resist to the coppered surface and imaging the resist, thereby forming resist voids;

(e) depositing copper in the resist voids;

(f) stripping the resist from the copper surface; and (g) etching off the copper in those regions which have previously been covered by the resist; the resist is preferably a photo imageable resist.

Photo imageable resists are usually acrylic-based resists, i.e., they have a (meth)acrylic backbone. They are usually applied as a dry film or a liquid film. The dry film is a common imageable photoresist consisting of a cover or support sheet, a photoimageable layer, and a protective layer, as provided by DuPont, Hitachi. Liquid photo resists are applied directly onto the copper layer by, e.g., roller coating, curtain coating, without protective layers (e.g., Huntsman, Rohm & Haas, Atotech).

These methods are well-known in the art and are for example described in: Coombs, *Printed Circuits Handbook* 5$^{th}$ *Edition,* or have been published in the internet under URL http://www.circuitree.com/copyright/2FBNP_GUID_9-5-2006_A_10000000000000244144 &message=1 or under URL http://www.circuitree.com/Articles/Column/16bc3b84a7809010VgnVCM100000f932a8c0_, both being accessed on 19 Feb. 2008, the disclosure thereof being entirely incorporated herein by reference.

The methods described herein may be performed in a conventional dip-tank technique (vertical processing) or in a conveyorized machine (horizontal processing).

All tested compounds were first prepared to be dissolved in a standard solution containing 1 g of the compound in 1 l of deionized water (acrylic compounds B, D and heterocyclic compound E) or in 1 l of ethylene glycol monobutylether (acrylic compounds A, C). Afterwards, to prepare adhesion agent compositions, all standard solutions were respectively added to solutions comprising 130 ml 50 vol-% sulfuric acid in 1 l of deionized water in an amount to achieve the desired concentration of the compound in the adhesion agent composition (1, 10, 20, 50 mg/l).

7.5 cm×15 cm large test panels were prepared from the following material:

Type A) Copper clad (35 μm copper) FR4 dielectric laminate, which was provided with an electroless copper layer of about 1 μm thickness (Printoganth® PV, Atotech Deutschland, Del.);

Type B) Copper Clad with 18 μm DC galvanized copper which was provided with an electroless copper layer of about 1 μm thickness (Printoganth® PV, Atotech Deutschland, Del.) (represents very smooth surface)

Type C) FR4 panels having copper clad (35 μm copper) which was further coated with an epoxy resin coating (Ajinomoto GX-13 from Ajinomoto Fine-Techno Co., JP), which was thereafter further coated with an electroless copper layer of about 1 μm thickness.

The test panels which were designated to be treated with comparative compounds A, B, C and D (acrylic compounds having general chemical formula I) or with 1H-1,2,4-triazole-3-thiol (heterocyclic compound comprising at least one thiol moiety according to the invention), compound E, were first treated with a 5 vol-% sulfuric acid solution, thereafter rinsed and then treated with the adhesion agent composition. The test panels, which were designated to be treated with compound E, were rinsed after the treatment with the adhesion agent composition. The test panels, which were designated to be treated with compound F, were, after the treatment with the adhesion agent composition, rinsed and thereafter treated with an aqueous solution of Dequest® 2010 (Thermophos Deutschland, Del.) at a concentration of 5 g Dequest® 2010 per liter.

For the treatment with the adhesion agent composition, all test panels were sprayed with these compositions for 30-45 s at 35-45° C. onto the surface thereof. After the respective last treatment step the panels were rinsed in deionized water and finally dried.

Further, reference panels were prepared using 5 vol-% sulfuric acid (reference sample X).

Afterwards, these test panels were laminated with a fine line dry film (25 μm thickness) using a hot-roll laminator. Using an artwork having 10 μm, 12 μm, 15 μm, 20 μm and 25 μm line width with varying spaces between the lines (FIG. 1), the dry film was exposed using a UV exposure unit. Unexposed film was removed with standard sodium carbonate developer solution, thereby removing the film except on the line features.

After developing, rinsing and drying, the test panels were evaluated by counting the number of completely intact lines for every line thickness. If all 36 lines remained completely intact during development (or after a tape test), the respective panel was assigned a value of 100%. In specific cases, a tape test was additionally performed after first visual inspection as described before. For this purpose, a tape (Scotch® Tape 600, 3M, US) was pressed onto the dry film pattern and the integrity of the lines was again visually inspected (marked with "TT" in the following Figs.).

Finally the panels prepared as described before were electroplated with copper using a vertical Cupracid® HL plating bath (Atotech Deutschland, Del.), thereafter rinsed and finally dried. The panels were again visually inspected to detect under-plating of copper under the resist. Such under-plating would point to a lack of resist adherence to the copper

Example 1

Concentration Dependency

First tests were performed on test panels Type A. The results obtained with the acrylic compounds A, B, C and D were in each case compared to results obtained with heterocyclic compound E according to the invention and with reference sample X (FIGS. 2-5). As there could not be detected any significant difference between the individual compounds and the reference sample being tested before applying a Scotch® tape, the graphs shown in FIGS. 2-5 refer to line integrity after tape testing.

Figure 6:
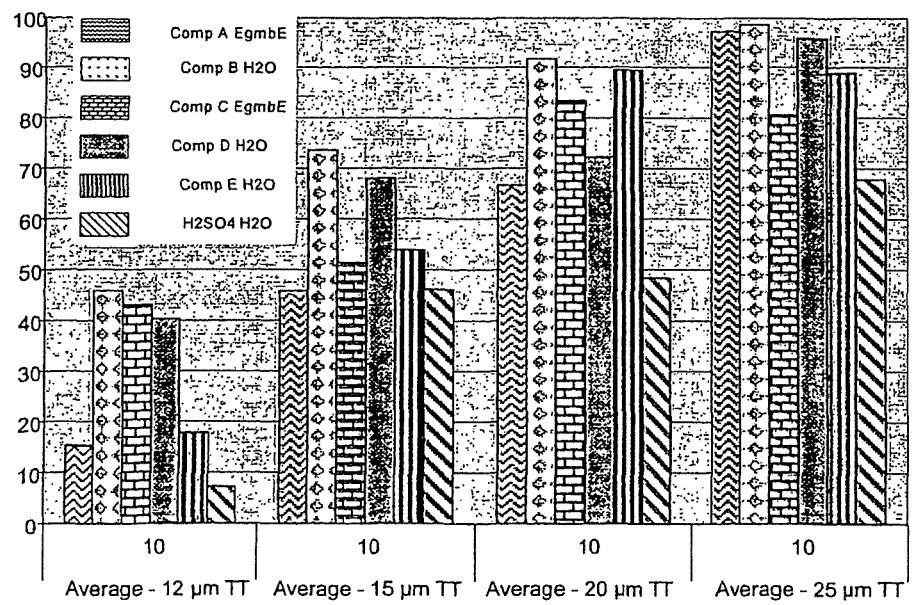
FIG. 6 shows results from pre-treating a coppered substrate with compound E (10 mg/l) and are compared to treatment with compounds A, B, C, D and with H₂SO₄.

A concentration of compounds A, B, C, D and E of 10-20 mg/l was found to give best performance. Adhesion performance of all compounds was superior compared to reference sample X. A comparison of the results for 10 mg/l compositions containing the compounds and for the reference sample X is shown in FIG. 6. Interestingly, compounds A and C performed in most cases a little worse than compounds B and D. This difference was believed to be due to the solvent being used to prepare the standard solutions. Therefore, further tests were performed to investigate the influence of the solvent and the influence of the type of test panels.

Example 2

Solvent and Panel Type Influence

This experiment was performed to observe the effect of the solvent and of the panel type on line integrity. Therefore, all tests were made on test panels Type A and Type B. Furthermore, acrylic compounds C and D were both dissolved in deionized water or in ethylene glycol monobutylether, respectively, in order to directly compare the influence of this solvent. The concentration of these compounds in the adhesion agent composition was 10 mg/l.

Figure 7:
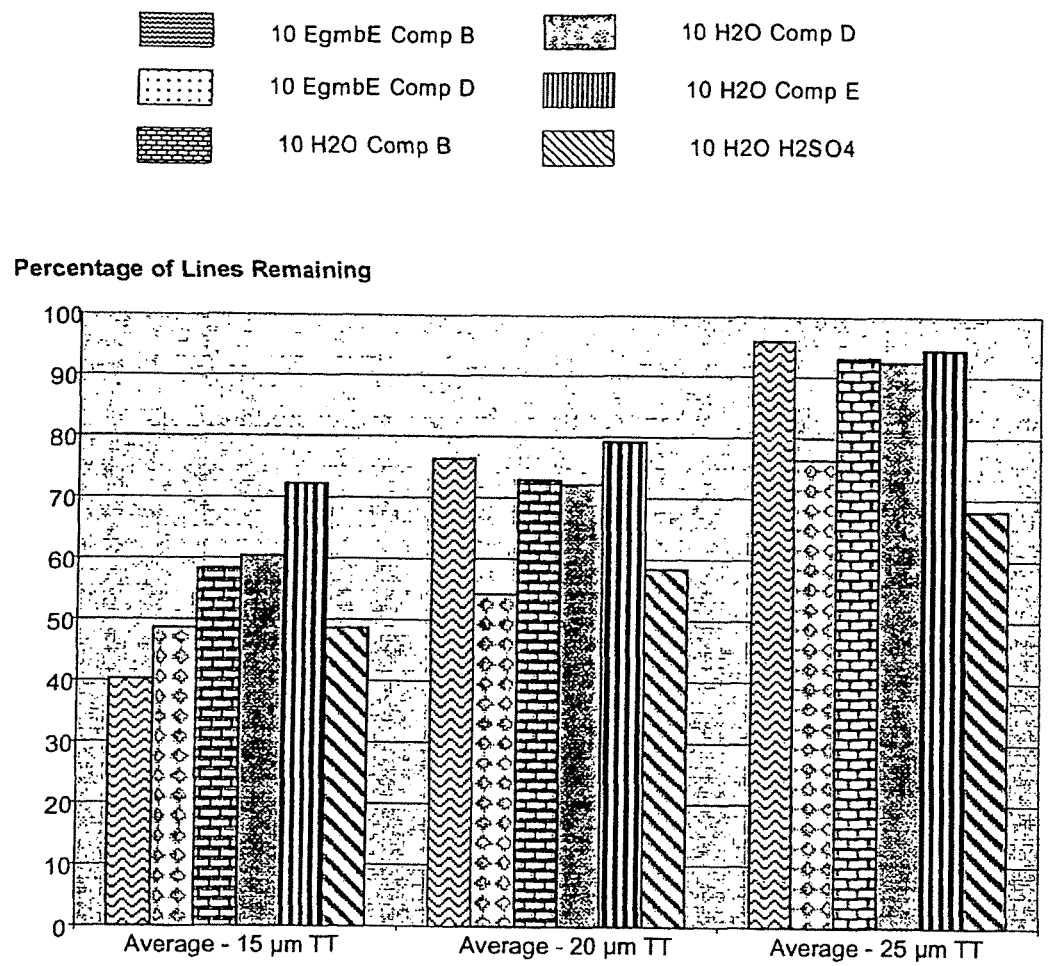
FIG. 7 shows results from pre-treating a coppered substrate with compound E (influence of solvent; Type A material) and are compared to treatment with compounds B, D and with H₂SO₄.
Figure 8:
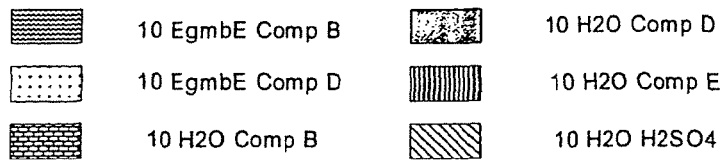
FIG. 8 shows results from pre-treating a coppered substrate with compound E (influence of solvent; Type B material) and are compared to treatment with compounds B, D and with H₂SO₄.
Figure 8:
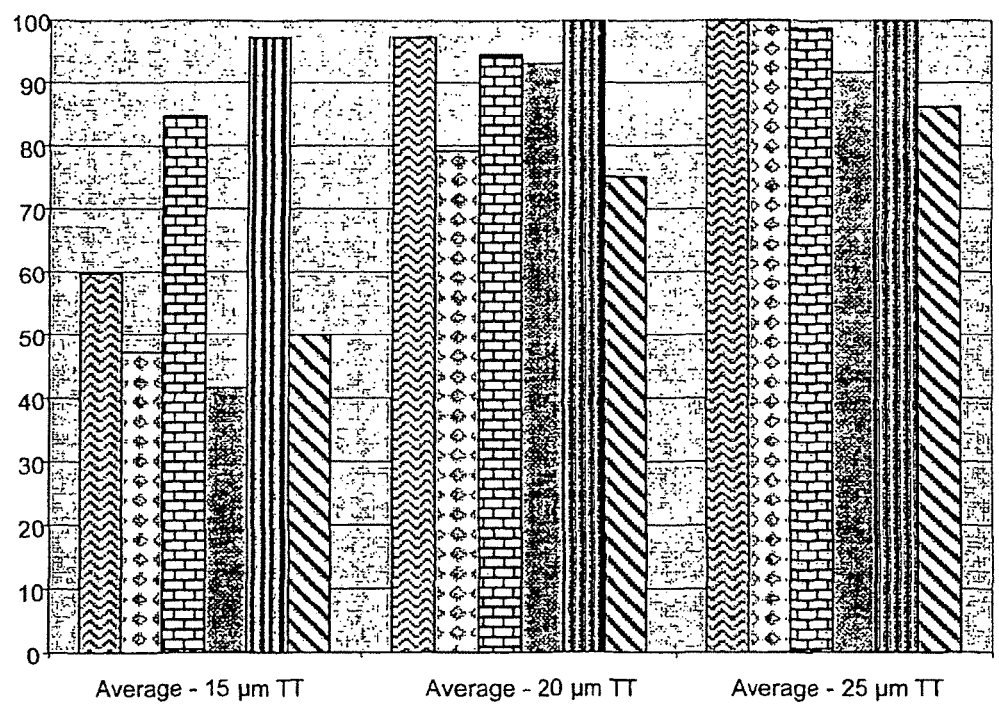

The results obtained after tape testing are shown in FIG. 7 (Type A material) and FIG. 8 (Type B material).

For Type A material, compound B being dissolved in ethylene glycol monobutylether to give the standard solution, gave similar results as compound B being dissolved in water on Type A material. Performance of compound D was always better without the ether solvent. Compared to compound E according to the invention, all results were more or less similar for all compounds (except for reference sample X) for 12 μm lines, but were different for wider lines. In these latter cases compound E resulted in higher adherence of the resist.

For Type B material, the difference between the compounds was found to be more pronounced in that compound B without ether solvent and compound E were better than the rest.

Figure 9:
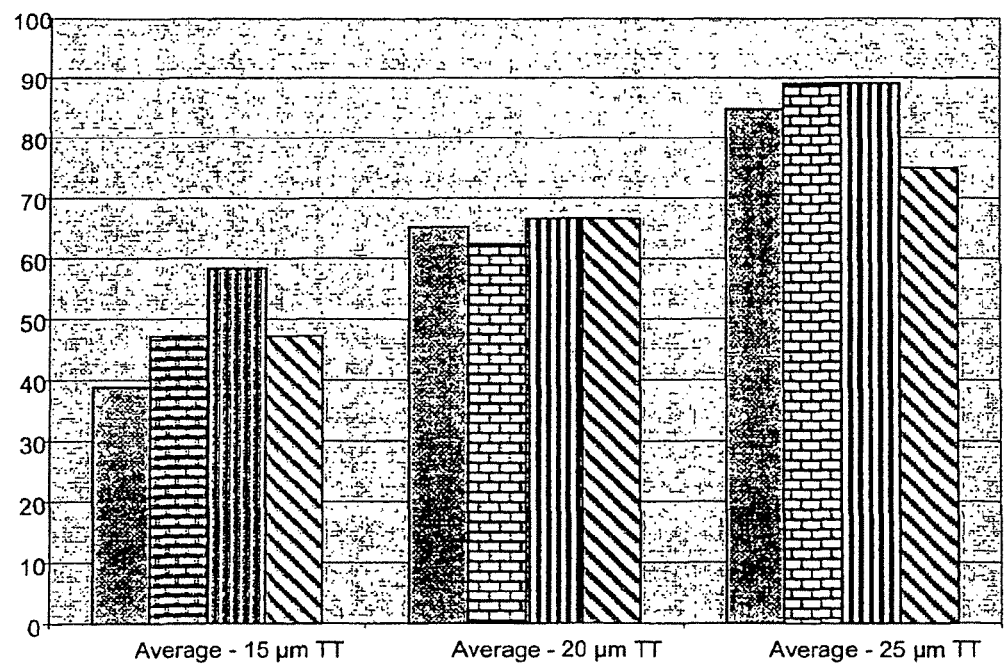
FIG. 9 shows results from pre-treating a coppered substrate with compound E (Type A material) and are compared to treatment with compounds A, C and with H₂SO₄.
Figure 10:
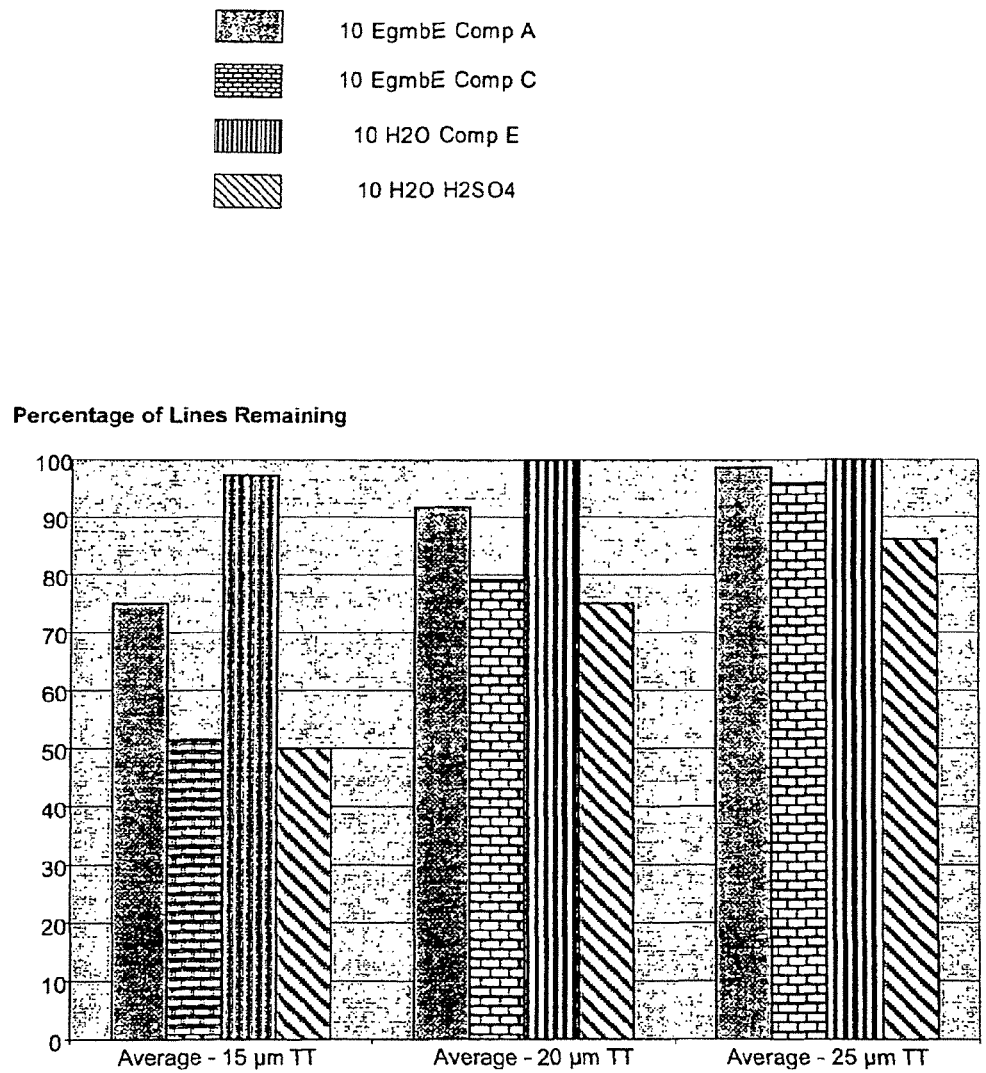
FIG. 10 shows results from pre-treating a coppered substrate with compound E (Type B material) and are compared to treatment with compounds A, C and with H₂SO₄.

Further results obtained with Type A and Type B material using compounds A and C, dissolved in the ether solvent, and compound E are shown in FIG. 9 (Type A material) and FIG. 10 (Type B material).

On Type A material, all three compounds presented similar results on all lines.

On Type B material, compound A had a better performance than compound C, but was worse than compound E.

Example 3

Comparison of Influence of Compound F on Resist Adherence

Figure 11:
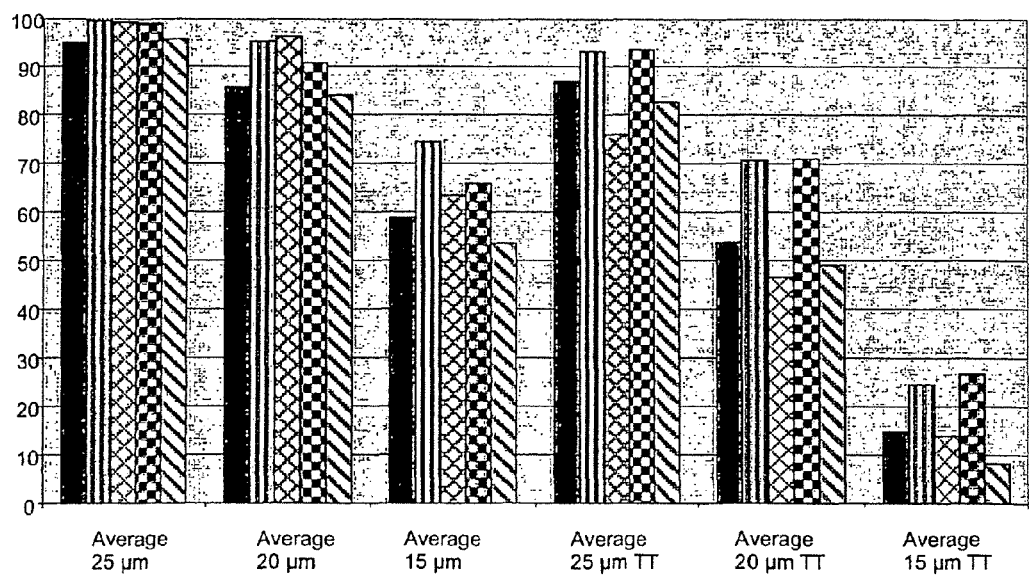
FIG. 11 shows results from pre-treating a coppered substrate with compounds E, F and F + post dip (PD) (Type A material) and are compared to treatment with compounds D and with H₂SO₄.

In these experiments compounds D, E, F and G (concentration: 1-100 mg/l) were investigated, with F being investigated with and without further post-dip in an aqueous solution of 1-hydroxyethylidene 1,1 diphosphonic acid and compared to reference sample X. Tests were performed on Type A material (FIG. 11; "PD": post-dip). Visual inspection was made before and after tape testing ("TT").

Figure 12:
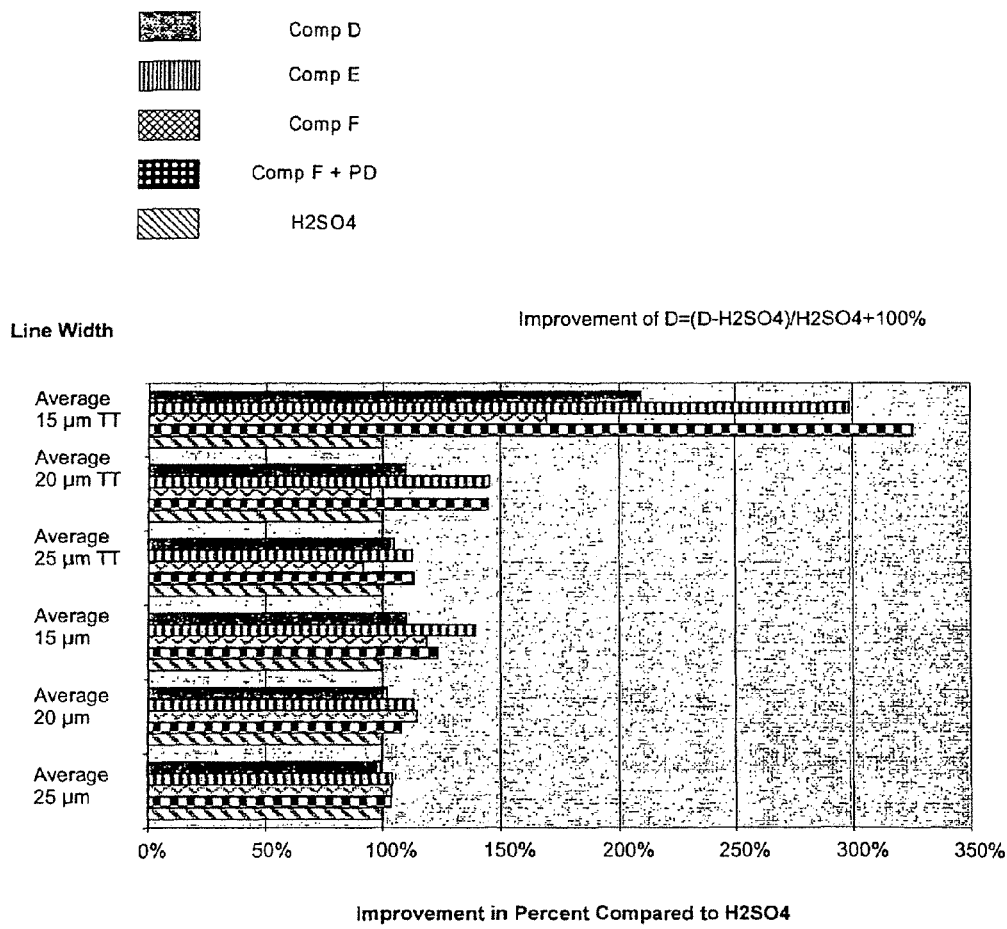
FIG. 12 shows a representation of the data of FIG. 11, being illustrated as a [%] improvement over the treatment with H₂SO₄.

Further, an alternative representation of the data obtained is shown in the diagram of FIG. 12, this diagram showing the improvement in [%] over treatment with Sample X.

The results of these tests after tape testing show that compound D has a slightly worse performance than compound E and that performance of compound F is comparable to that of Compound E.

Figure 14:
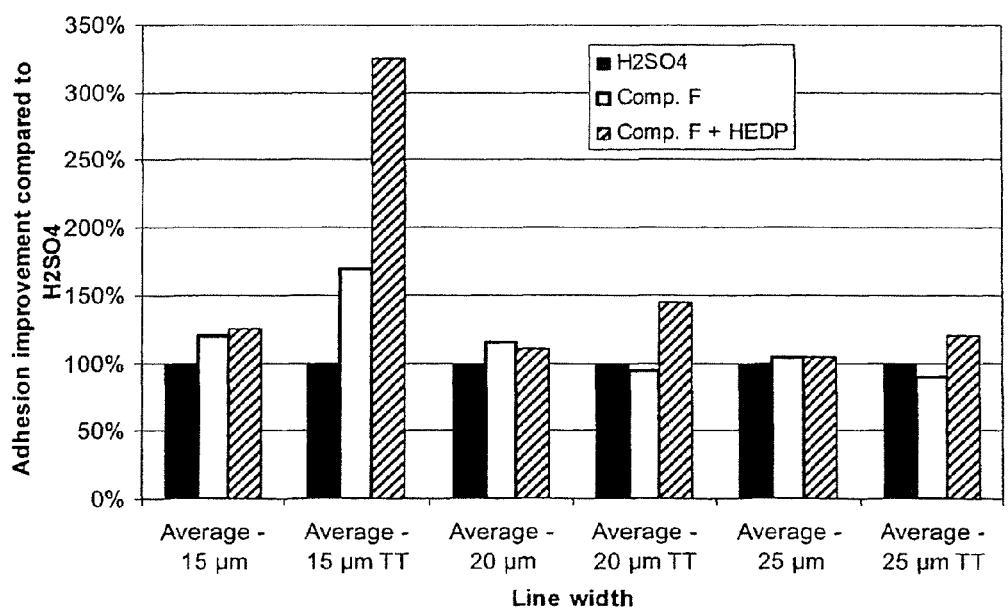
FIG. 14 shows results from pre-treating a coppered substrate with compound F and with compound F + post dip and are compared to treatment with H₂SO₄.

A further experiment showing superior performance of a two-step method comprising treating the base material with compound F in a first method step and with 1-hydroxyethylidene-1,1-diphosphonic acid in a second method step as compared to a one-step method wherein the material was treated with compound F only or wherein the copper lines were treated with 5 vol-% sulfuric acid only is shown in FIG. 14. In this case improvement of the adhesion of the resist on the copper lines was measured compared to adhesion after treatment with 5 vol-% sulfuric acid (reference value: 100%). Adhesion was tested with tape testing (experiments denoted with "TT"), indicating the percentage of faultless lines with resist remaining thereon after a tape has been peeled off. As a reference, the percentage of faultless lines is shown which were achieved by exposing, developing and drying the photoresist used for defining the lines, but without performing the tape test (experiments denoted without "TT"). An excellent resist-to-copper adhesion was achieved on 15 μm wide copper lines, if the two-step process was used.

In another experiment, instead of compound F, compound G was used. In this case a comparison was made between the performance achieved with a respective one-step pre-treatment with compounds E and G. The experimental conditions were the same as before with pre-treatment with compound F, except that a one-step pre-treatment was performed (instead of a two-step pre-treatment with compound F). In this case 0.02 g of the respective thiol compounds were used in a solution containing 130 ml/l concentrated sulfuric acid.

Figure 15:
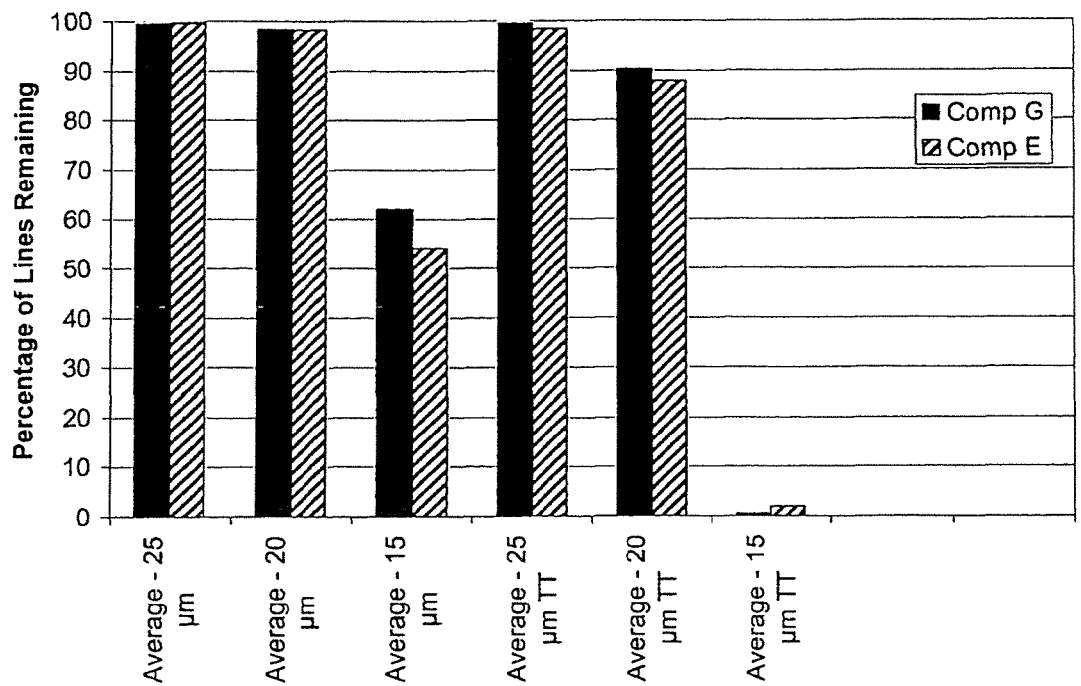
FIG. 15 shows results from pre-treating a coppered substrate with compound G as compared to compound E.

The resist-to-copper adhesion results obtained are shown in FIG. 15 after a tape having been peeled off the copper lines (experiments denoted with "TT"), indicating the percentage of faultless lines resist remaining thereon after the tape has been peeled off and, as a reference, the percentage of faultless lines is shown in FIG. 15 which were achieved by exposing, developing and drying the photoresist used for defining the lines, but without performing the tape test (experiments denoted without "TT"). An excellent resist-to-copper adhesion was achieved on 20 and 25 μm wide copper lines. No substantial differences were observed with the pre-treatment with compounds E and G.

Example 4

Comparison of Resist-to-Copper Adhesion, Performance of Compound E Compared Other Heterocyclic Compound In another experiment resist-to-copper adhesion was measured after treatment of copper lines was performed with compound E (0.02 g+130 ml/l conc. $H_2SO_4$) as compared to treatment with 2-mercaptobenzothiazole (0.5 g/l+20 g/l KOH) and as compared to sulfuric acid (130 ml/l conc. $H_2SO_4$) treatment. Adhesion was measured as the amount of resist remaining on the copper lines after tape testing.

Figure 13:
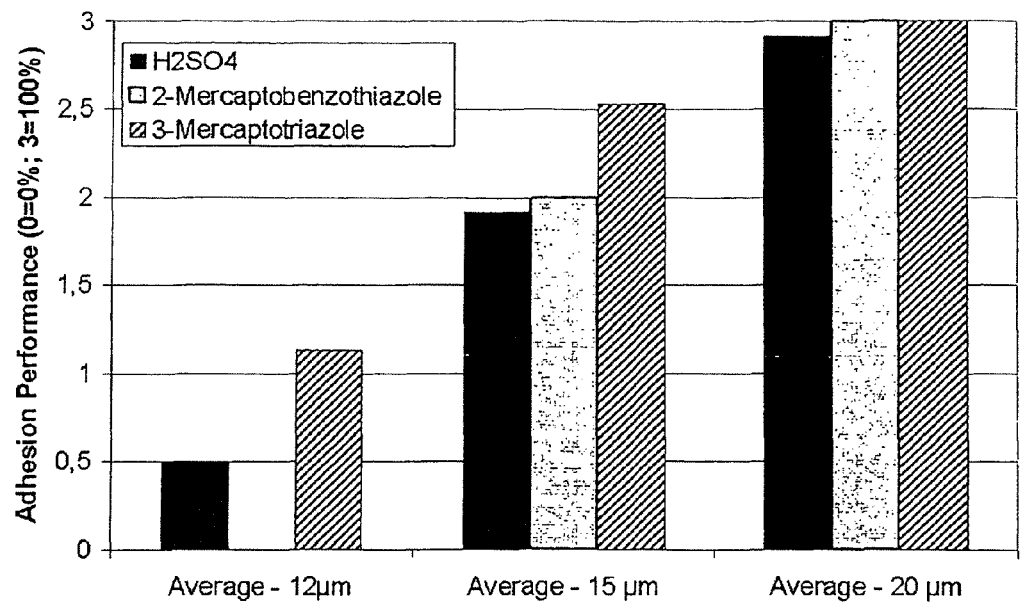
FIG. 13 shows results from pre-treating a coppered substrate (Type B material) with compound E and are compared to treatment with 2-mercaptobenzothiazole and to treatment with H₂SO₄.

Best results of resist-to-copper adhesion in a tape testing assay was found with compound E, especially if 12 μm and 15 μm wide copper lines were examined (FIG. 13). 2-mercaptobenzothiazole completely failed on 12 μm wide copper lines.

Example 5

Copper-to-Copper Adherence

Pre-treatment with adhesion agent compositions containing compounds A, B, C, D (comparative example) and E (example of the invention) was performed (concentration 10 mg/l) and the dry film applied, exposed and developed as before. The panels were then electrolytically copper plated to achieve a 15 μm thick copper deposit.

Visual inspection showed that no under-plating of copper under the resist has occurred. After tape testing on the copper surface, no peeling-off of the plated copper could be detected. This result points to a good copper-to-copper adherence.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

a) heterocyclic compounds comprising at least one thiol moiety, said compounds being selected from the group consisting of compounds having at least one of formulae IIIA and IIIB:

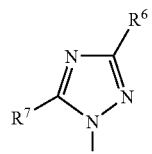

IIIA

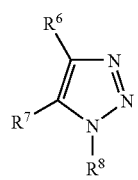

IIIB wherein
R$^6$ and R$^7$ are independently selected from the group comprising H, SR$^9$, OR$^9$, NR$^{10}$R$^{11}$ and C$_1$-C$_4$ alkyl;
R$^8$ is H or C$_1$-C$_3$ alkyl;
R$^9$ is selected from the group comprising H, Li, Na, K and NH$_4$;
R$^{10}$ and R$^{11}$ are independently selected from the group comprising H, CH$_3$ and C$_2$H$_5$;
with the proviso that at least one of R$^6$ and R$^7$ is SR$^9$; and
b) quaternary ammonium polymers having general chemical formula II:

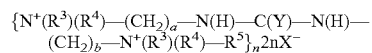

II

TABLE 1

Test compounds

| Compound | Chemical Name | Trade Name | Available from |
|---|---|---|---|
| Compound A (comparative example) | 2-[3-(2H-benzotriazol-2-yl)-4-hydroxyphenyl] ethyl methacrylate | | Sigma-Aldrich |
| Compound B (comparative example) | 2-(tert-butylamino) ethyl methacrylate | | Sigma-Aldrich |
| Compound C (comparative example) | methacrylic acid octadecyl ester | | Sigma-Aldrich |
| Compound D (comparative example) | 2-(methacryloyloxy)ethyl trimethylammonium methosulfate | | Sigma-Aldrich |
| Compound E | 1,2,4-triazole-3-thiol | | Sigma-Aldrich |
| Compound F | poly{bis(2-chloroethylether-alt-1,3-bis[3-(diemthylamino)propyl]urea}, quaternized solution | Polyquaternium-2 | Sigma-Aldrich |
| Compound G | 3-amino-1,2,4-triazole-5-thiol | | Sigma-Aldrich |

The invention claimed is:

1. A non-etching non-resist composition for the treatment of copper or copper alloys, the composition consisting essentially of:
at least one mineral acid or at least one organic acid, wherein said at least one mineral acid is selected from the group consisting of sulfuric acid and phosphoric acid;
at least one solvent selected from the group consisting of water and an organic solvent;
at least one adhesion agent selected from the group consisting of:

wherein:
R$^3$ and R$^4$ are independently methyl, ethyl, isopropyl, hydroxymethyl, hydroxyethyl or —CH$_2$CH$_2$(OCH$_2$CH$_2$)$_c$OH;
R$^5$ is (CH$_2$)$_d$ or {(CH$_2$)$_e$O(CH$_2$)$_f$}$_g$;
Y is O, S or NH;
a, b, c, d, e and f are each independently an integer from 1 to about 6;
g is an integer from 1 to about 4;
n is an integer being at least 1; and
X$^−$ is a halide ion, and wherein the composition is free of an oxidant for the copper or the copper alloys and wherein the composition is non-etching under conditions of conventional dip-tank techniques.

2. The non-etching non-resist composition for the treatment of copper or copper alloys according to claim 1, wherein said at least one adhesion agent comprises at least one triazole compound comprising at least one thiol moiety according to said at least one of formulae IIIA and IIIB.

3. The non-etching non-resist composition for the treatment of copper or copper alloys according to claim 1, wherein the heterocyclic compounds comprising at least one thiol moiety are selected from the group consisting of 1H-1,2,4-triazole-3-thiol and 3-amino-1,2,4-triazole-5-thiol.

4. The non-etching non-resist composition for the treatment of copper or copper alloys according to claim 1, wherein said at least one adhesion agent comprises at least one compound in accordance with formula II with $R^3$ and $R^4$ being methyl.

5. The non-etching non-resist composition for the treatment of copper or copper alloys according to claim 1, wherein said at least one adhesion agent comprises at least one compound in accordance with formula II with a and b being 3.

6. The non-etching non-resist composition for the treatment of copper or copper alloys according to claim 1, wherein said at least one adhesion agent comprises at least one compound in accordance with formula II with Y being O.

7. The non-etching non-resist composition for the treatment of copper or copper alloys according to claim 1, wherein said at least one adhesion agent comprises at least one compound in accordance with formula II with $R^5$ being $\{(CH_2)_e O(CH_2)_f\}_g$.

8. The non-etching non-resist composition for the treatment of copper or copper alloys according to claim 1, wherein said at least one adhesion agent comprises at least one compound in accordance with formula II with e and f being 2.

9. The non-etching non-resist composition for the treatment of copper or copper alloys according to claim 1, wherein said at least one adhesion agent comprises at least one compound in accordance with formula II with g being 1.

10. The non-etching non-resist composition for the treatment of copper or copper alloys according to claim 1, wherein said at least one adhesion agent comprises at least one compound in accordance with formula II with $X^-$ being chloride.

11. The non-etching non-resist composition for the treatment of copper or copper alloys according to claim 1, wherein said at least one adhesion agent comprises at least one quaternary ammonium polymer having general chemical formula II and wherein said at least one quaternary ammonium polymer having general chemical formula II has the following general chemical formula IIA:

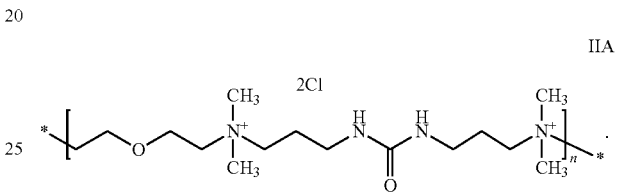

12. The non-etching non-resist composition for the treatment of copper or copper alloys according to claim 1, wherein the adhesion agent is contained in the composition at a concentration of from 1 mg/l to 1000 mg/l.

* * * * *

UNITED STATES PATENT AND TRADEMARK OFFICE
CERTIFICATE OF CORRECTION

| | |
|---|---|
| PATENT NO. | : 8,945,298 B2 |
| APPLICATION NO. | : 12/867112 |
| DATED | : February 3, 2015 |
| INVENTOR(S) | : Christian Sparing et al. |

Page 1 of 1

It is certified that error appears in the above-identified patent and that said Letters Patent is hereby corrected as shown below:

In the Specification

Column 11, after Line 60 and before the paragraph beginning "All tested" insert the following paragraph: -- In order to investigate compounds for pre-treating a copper surface for subsequent resist application, four different acrylic compounds A, B, C and D having general chemical formula I were used. In order to investigate new compounds, two heterocyclic compounds comprising at least one thiol moiety have been used (compounds E, G). Further, on quaternary ammonium polymer having general chemical formula II has been used (compound F). The compounds are listed in Table 1. --

Column 12, Lines 9, 13, 34, and 64, change "Del." to -- DE --

Signed and Sealed this
Thirtieth Day of June, 2015

Michelle K. Lee
*Director of the United States Patent and Trademark Office*